US005625565A

United States Patent [19]
Van Dyke

[11] Patent Number: 5,625,565
[45] Date of Patent: Apr. 29, 1997

[54] SYSTEM AND METHOD FOR GENERATING A TEMPLATE FOR FUNCTIONAL LOGIC SYMBOLS

[75] Inventor: Eric J. Van Dyke, Aromas, Calif.

[73] Assignee: Cadence Design Systems, Inc., San Jose, Calif.

[21] Appl. No.: 303,393

[22] Filed: Sep. 9, 1994

[51] Int. Cl.⁶ ................................................ G06F 17/50
[52] U.S. Cl. .................................... 364/489; 364/488
[58] Field of Search ................................ 364/488, 489, 364/490, 491

[56] References Cited

U.S. PATENT DOCUMENTS

| | | | |
|---|---|---|---|
| 5,164,908 | 11/1992 | Igarashi | 364/491 |
| 5,175,696 | 12/1992 | Hooper et al. | 364/489 |
| 5,212,650 | 5/1993 | Hooper et al. | 364/489 |
| 5,274,793 | 12/1993 | Kuroda et al. | 395/500 |
| 5,278,769 | 1/1994 | Bair et al. | 364/490 |
| 5,297,053 | 3/1994 | Pease et al. | 364/747.24 |
| 5,301,318 | 4/1994 | Mittal | 395/500 |
| 5,303,161 | 4/1994 | Burns et al. | 364/490 |
| 5,331,568 | 7/1994 | Pixley | 364/489 |
| 5,367,468 | 11/1994 | Fukasawa et al. | 364/490 |
| 5,504,691 | 4/1996 | Kostelijk | 364/489 |
| 5,510,998 | 4/1996 | Woodruff et al. | 364/489 |

OTHER PUBLICATIONS

"Databases and Cell–Selection Algorithms for VLSI Cell Libraries" by S. Y. Foo et al., Computer, No. 2, Feb. 23, 1990, Los Alamitos, CA., pp. 18–30.

J. Lahti et al., "Logic Compilation from Graphical Dependency Notation", IEEE International Conference on Computer–Aided Design (11 Nov. 1990) Santa Clara, US, pp. 474–477.

*Primary Examiner*—Vincent N. Trans
*Attorney, Agent, or Firm*—John T. McNelis, Esq.

[57] ABSTRACT

The system and method improves Electronic Design Automation practices by creating a data template representing pins, elements, and dependencies for numerous components in the same functional class. A pin having the same function is represented once on the data template even if the pin name is different. Sequences of component pins having the same function are combined and are represented by a single pin on the data template. The performance of functional logic symbol generation systems increases significantly because the data template enables the creation of functional logic symbols to be accomplished quickly, accurately, and consistently.

19 Claims, 7 Drawing Sheets

SYSTEM AND METHOD FOR GENERATING A TEMPLATE FOR FUNCTIONAL LOGIC SYMBOLS

BACKGROUND OF THE INVENTION

1. Field of the Invention

The present invention relates generally to the field of Computer Automated Design (CAD) systems, particularly to graphic symbol storage and generation on CAD systems.

2. Description of Background Art

Graphic symbols are useful for characterizing the functionality of electronic devices. The American National Standards Institute (ANSI) and the Institute of Electrical and Electronic Engineers (IEEE) developed the ANSI/IEEE Standard 91-1984, hereafter "the standard," to guide design engineers in constructing graphic symbols for logic devices, hereafter "functional logic symbols."

Functional logic symbols accurately and concisely illustrate the logical functions of devices. The standard utilizes various features to illustrate the logical function of these devices. These features include pins, elements, and dependency notations. Pins denote electrical connections to the device. Each pin may be associated with one or more attributes that indicate the functions of the pin, e.g., a logic negation symbol. Elements are groups of pins and sub-elements that comprise a functional unit within the device, e.g., an AND-GATED device. Dependency notations are graphics, including text, that are used to describe detailed functional relationships between pins. A more detailed description of these features is given below.

One area where functional logic symbols are used is in the area of Electronic Design Automation (EDA). Engineers use EDA tools to design electrical circuits, e.g., an application specific integrated circuit (ASIC). When designing an electrical circuit, functional logic symbols are displayed on the computer monitor to represent the functional logic devices, e.g., a flip flop, within the circuit. Conventional EDA systems comprise a symbol library that contains functional logic symbols representing thousands of functional logic devices. Each functional logic device is uniquely represented by a functional logic symbol.

Generating and maintaining these symbol libraries is problematic. Conventional libraries are generated manually by a graphic symbol designer. Generating and maintaining a symbol library requires an annual investment of several person-years. In addition to the labor costs involved in generating and maintaining a symbol library, the library frequently contains errors and inconsistencies, e.g., pin spacing or pin ordering may differ for similar devices. Consistency is important when using the standard in order for an engineer to quickly and accurately discern the function of a device. Another problem with conventional systems is that significant memory is required to store the graphical representation for each function logic device.

It is therefore desirable to provide a system and method for quickly generating an accurate and consistent functional logic symbol while reducing the expense in generating and maintaining the symbol library and while reducing amount of memory necessary to store the symbol library.

SUMMARY OF THE INVENTION

The invention is a system and method for improving Electronic Design Automation systems. The invention resides in creating a data template representing pins, elements, and dependencies for numerous devices in the same functional class. All pins having the same function are represented once on the data template even if the pins have different names. In addition, sequences of device pins are combined and are represented by a single pin on the data template.

Through this invention, the performance of functional logic symbol generation systems increases significantly because the data template enables the creation of functional logic symbols to be accomplished quickly, accurately, and consistently.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

The invention is directed to a system and method for generating a function template that represents logic devices within a functional category (described below). All functionally equivalent pins associated with logic devices in a functional category are represented only once on the template. In addition, sequences of related physical pins are represented only once on the template. Accurate and consistent functional logic symbols are generated using the template.

Figure 1:
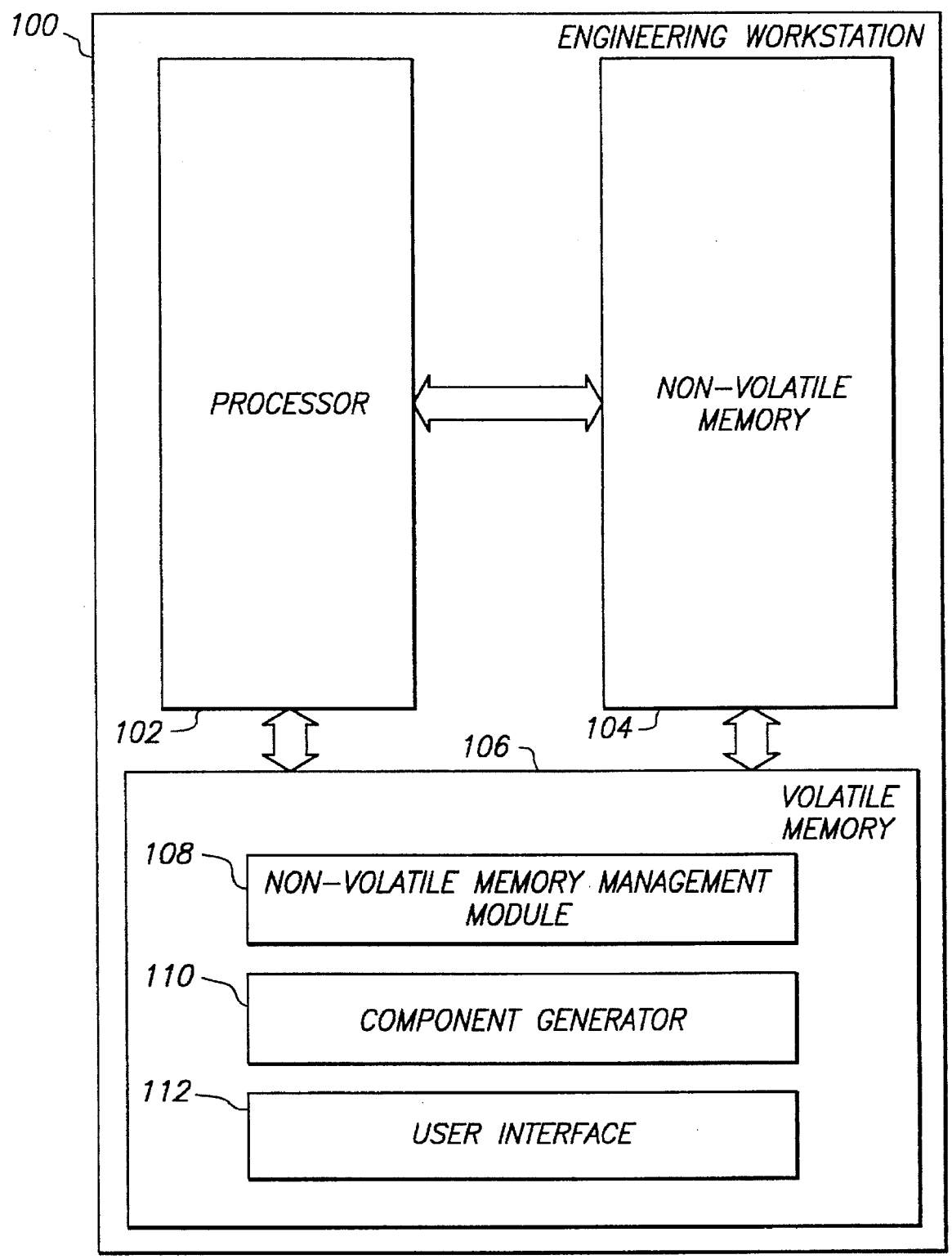
FIG. 1 is an illustration of the environment in which the preferred embodiment of the present invention resides.

FIG. 1 illustrates an engineering workstation 100 according to the preferred embodiment of the present invention. The engineering workstation 100 includes a processor 102 and memory 104, 106. In the preferred embodiment non-volatile memory 104 and volatile memory 106 are used. Within the volatile memory 106 are three major modules. A non-volatile memory management module (NVMMM) 108 controls data transfer to and from the non-volatile memory 104. The user interface 112 enables a user to interact with the component module 110 and the NVMMM 108. The component generator 110 creates component (device) models. A more detailed description of each of these modules is set forth below.

Figure 2:
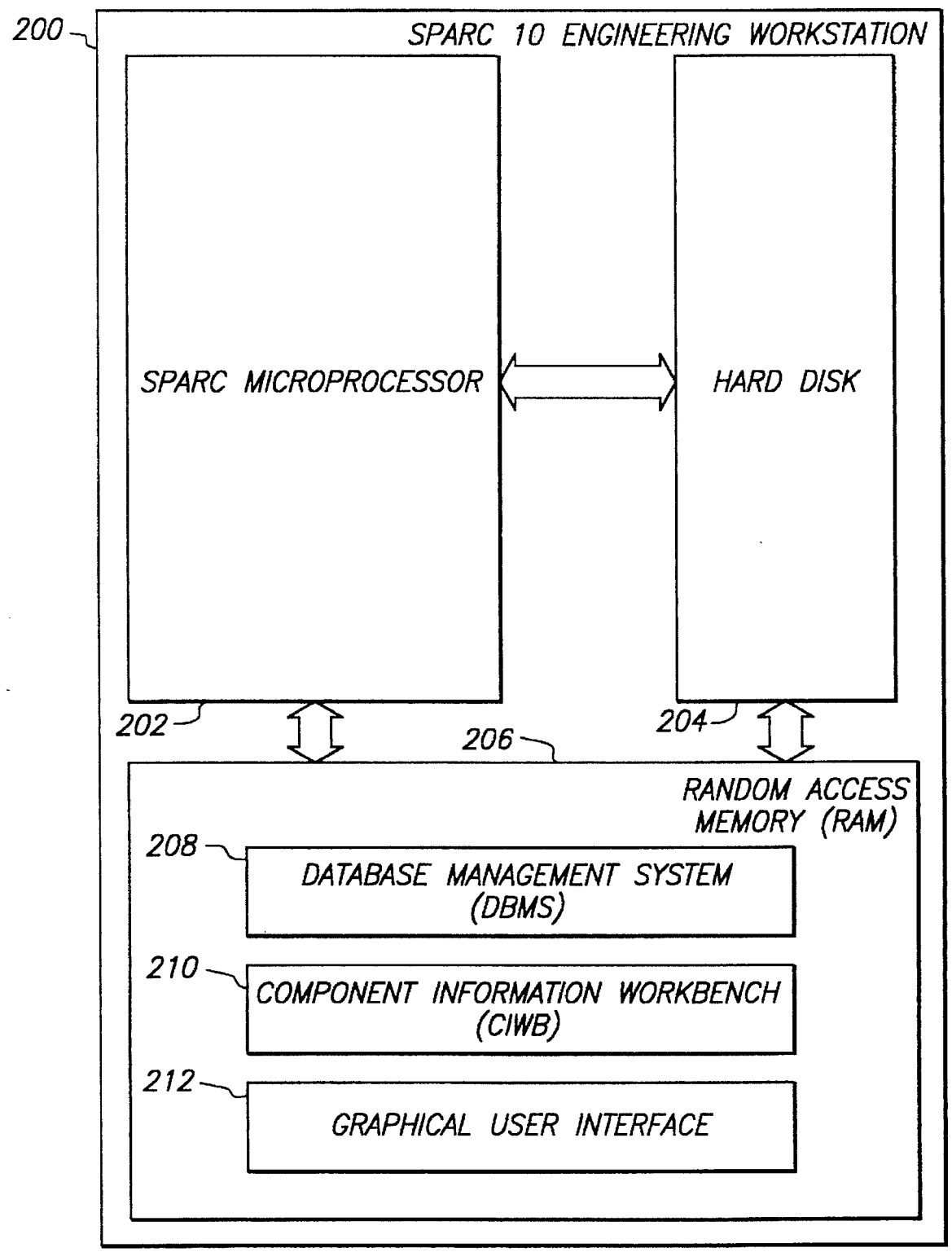
FIG. 2 is a more detailed illustration of the environment in which the preferred embodiment of the present invention resides.

FIG. 2 illustrates a more detailed environment in which the preferred embodiment of the invention resides. In the preferred embodiment the processor 102 is a conventional SPARC microprocessor. The non-volatile memory 104 is a hard disk storage device 204.

The volatile memory 106 is a SPARC Workstation random access memory (RAM) 206. A database management system (DBMS) 208 such as "Object Store" from Object Design, Inc., located in Burlington Mass., is used as the non-volatile memory management module 108. A graphical user interface (GUI) 212, such as the X Window System, version 11 developed by the Massachusetts Institute of Technology, is used as the user interface 112. In the preferred embodiment, the component generator 110 is the component information workbench (CIWB) 210 as described in greater detail below with reference to FIG. 3.

Figure 3:
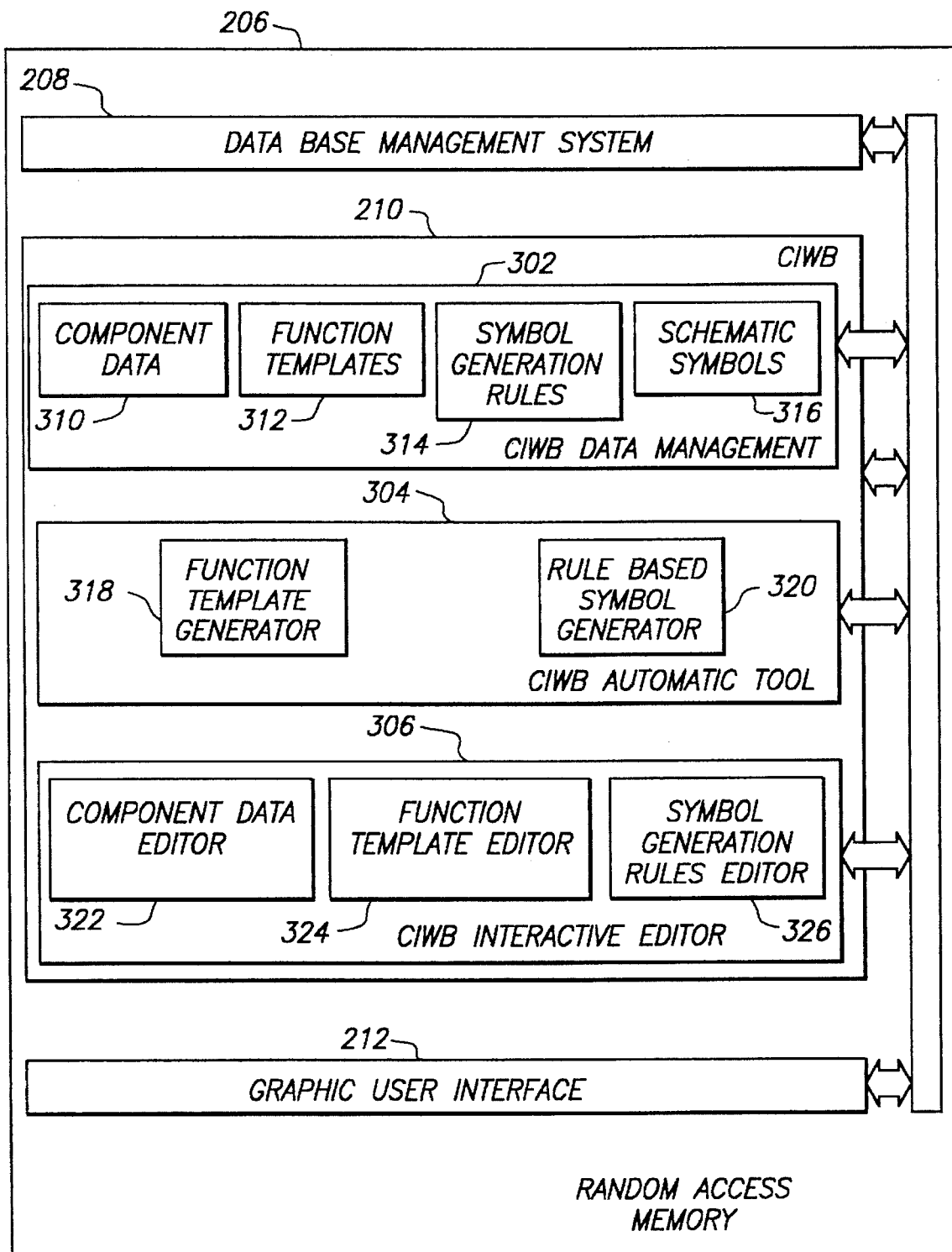
FIG. 3 is a more detailed illustration of the component information workbench of FIG. 2.

FIG. 3 is a detailed illustration of the CIWB 210 of the present invention. A detailed description of the functions performed by CIWB modules 302–326 is given below with respect to FIGS. 4–6. A CIWB data management module 302 includes four modules, namely, a component data module 310, a function templates module 312, a symbol generation rules module 314, and a schematic symbols module 316. The component data module 310 includes data representing the functional category and the set of physical pin names for every component. The function templates module 312 includes data representing logical pin names, logical elements, and pin-to-pin dependency notation for each function template. The symbol generation rules module 314 includes data describing the rules to be used in building functional logic symbols (schematic symbols). The standard defines some of these rules, such as the height of dependency notation text in relation to the size of the functional logic symbol of the component. The schematic symbols module 316 includes data representing the graphical symbols that are output to a computer monitor during EDA (described above).

The CIWB automatic tool module 304 includes two modules, namely, a function template generator 318 and a rule based symbol generator 320. The function template generator 318 generates and modifies the function templates as described in greater detail below with reference to FIGS. 4–6. The rule based symbol generator 320 generates the schematic symbols (functional logic symbols), that are stored in the schematic symbol modules 316 using data from the function templates modules 312 and the symbol generation rules module 314. A more detailed description of the function of the rule based symbol generator 320 is set forth below.

The CIWB interactive editor 306 includes three modules, a component data editor 322, a function template editor 324, and a symbol generation rules editor 326. The component data editor 322 permits a user to provide and modify component data, e.g., the functional category, the physical pin names, and the pin dependencies of the component. The function template editor 324 enables a user to modify the function template. The component data editor 322 and the function template editor 324 are described in greater detail below with reference to FIGS. 4–6. The symbol generation rules editor 326 enables a user to modify the symbol generation rules 314 used to generate the functional graphic symbols that are stored in the schematic symbols module 316 as described above.

Figure 4A:
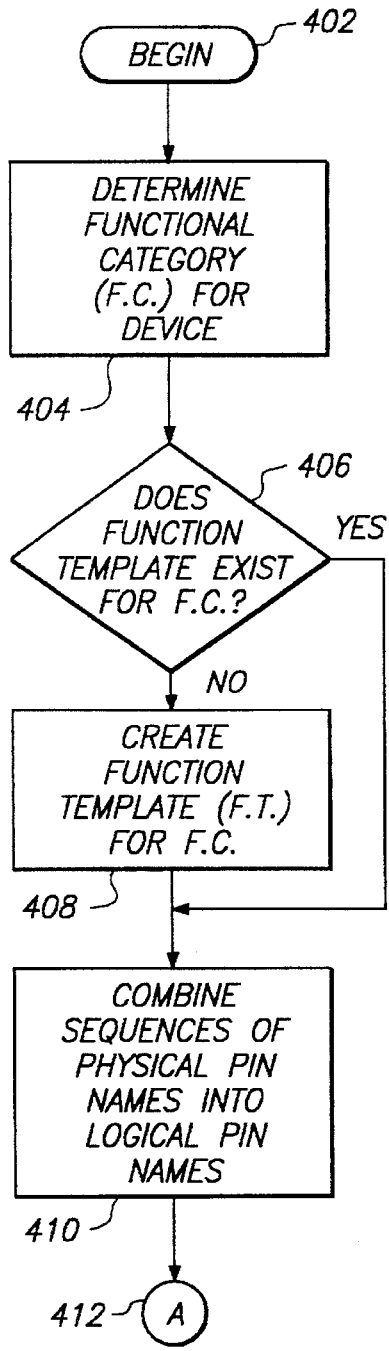
FIGS. 4A, 4B, 5 and 6 are flow diagrams showing the method of the preferred embodiment of the present invention.
Figure 4B:
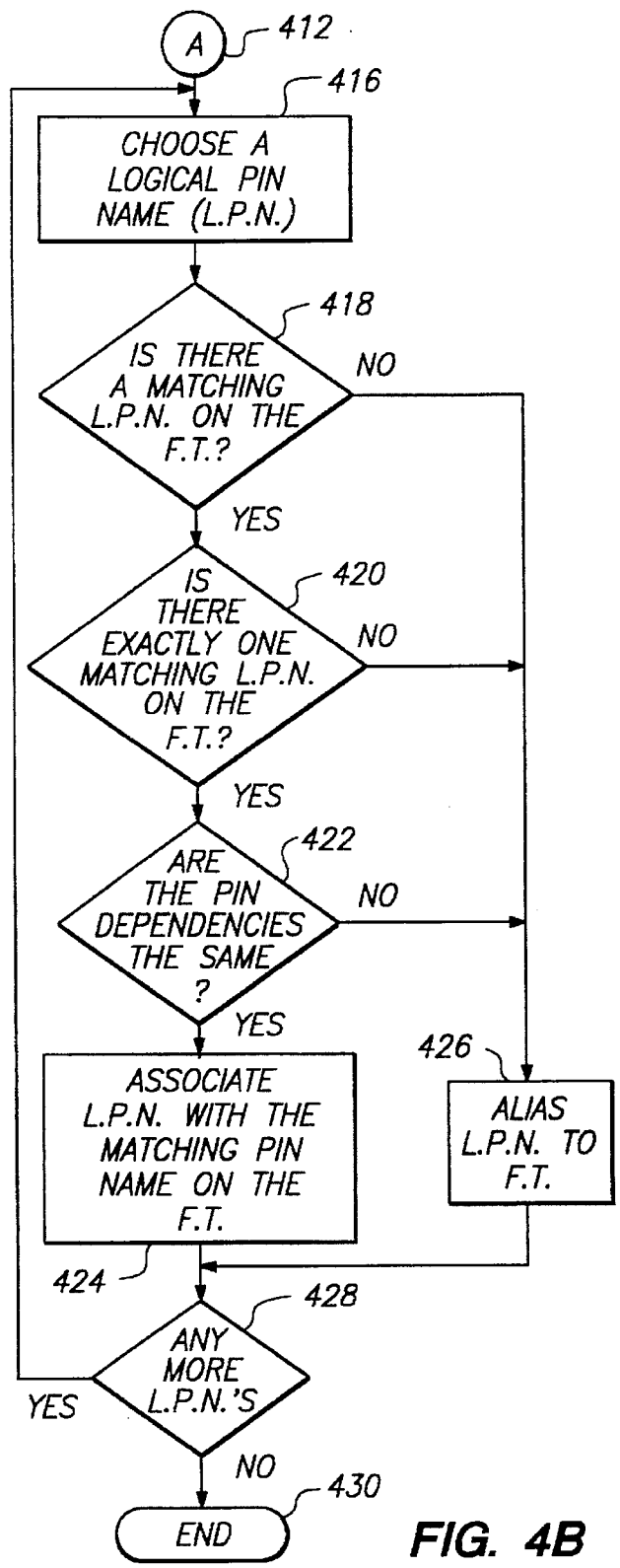
Figure 5:
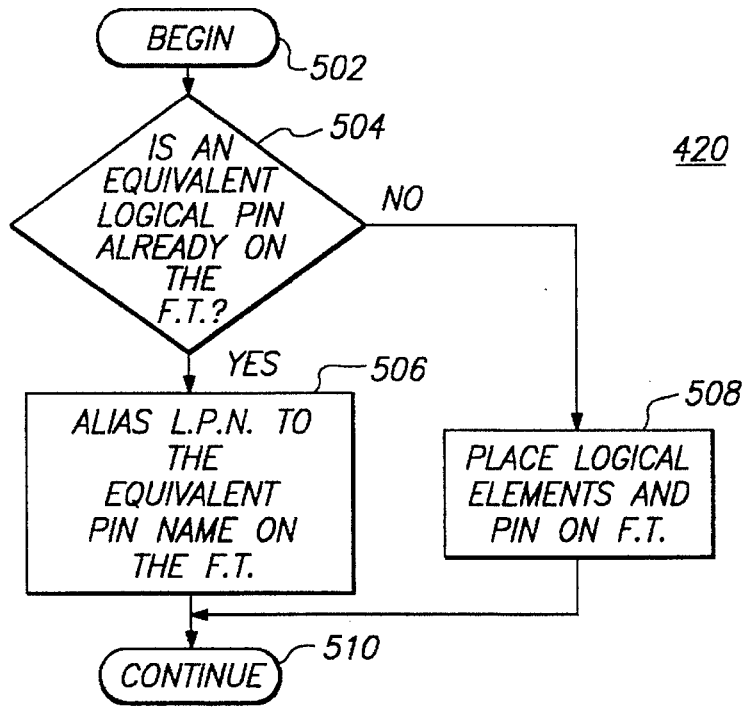
Figure 6:
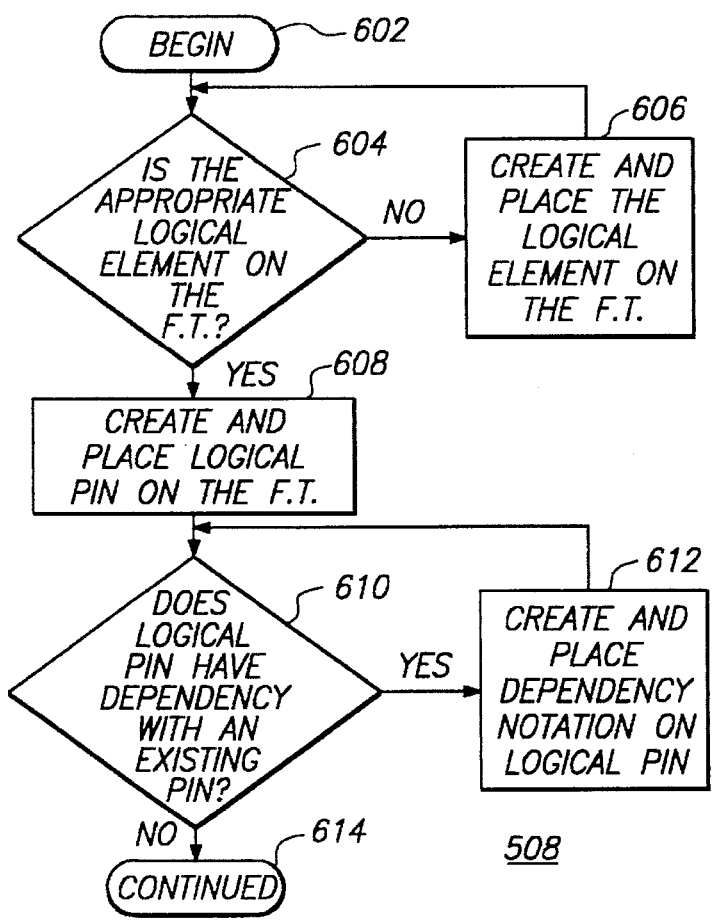

FIGS. 4–6 are flow diagrams illustrating the method of the present invention. The CIWB 210 operates on two levels. First, the CIWB 210 generates and maintains function templates. Second, the CIWB 210 generates instances. An instance is a representation of the functions of a single device while a function template is a representation of the functions of a plurality of devices having the same functional category. The CIWB can generate a template and an instance separately or simultaneously, i.e., the CIWB operates separately or simultaneously. When operating separately, the CIWB generates a function template after receiving information from many components in the functional category. Thereafter, the CIWB generates an instance after receiving information from a specific component. When operating simultaneously, the CIWB generates a function template and an instance simultaneously. The CIWB separate and simultaneous operation techniques are similar and are described below.

When operating separately, the CIWB receives component information from the component data module 310. Such information includes the functional category of the component, the names of each pin and element, and dependency information for each pin and element when the CIWB is operating in automatic mode, described below.

A functional category describes a group of components having functions that are closely related. The exact demarcation of functional categories is subjective. That is, a single component can be associated with different functional categories depending upon how a design engineer defines the functional categories.

In the preferred embodiment, a design engineer associates a component with a single functional category. The functional categories are aligned with the categorization definition in the ANSI/IEEE Standard 91-1984. Although components having the same functional category have closely related functions, the features of the components may vary significantly. Examples of such variations include: (1) the number of distinct functional elements contained within the component, e.g., one component may contain a single J-K flip-flop (JKFF) while another component in the same functional category may contain two or more similar JKFFs; (2) the sharing of pins among function elements; (3) the number of input or output pins; (4) the width of busses; (5) differences in pin polarity; (6) ancillary features, e.g., PRESET or CLEAR pins; and (7) variations in detailed behavior, e.g., pulse triggered or edge triggered JKFFs.

The function template generator 318 receives 404 the component information for the device. If a function template does not exist for the functional category 406 the function template generator 318 creates 408 an empty function template and associates the function template with the functional category of the component.

A variety of physical pin names are associated with each component. Component manufacturers describe various physical pins on the component by a name that reflects its functionality. For example, a pin fox receiving a timing signal is frequently called a CLOCK, a CLK, or a C pin. The present invention uses this naming convention to combine 410 sequences of physical pin names into a single logical pin name on the function template.

Figure 7:
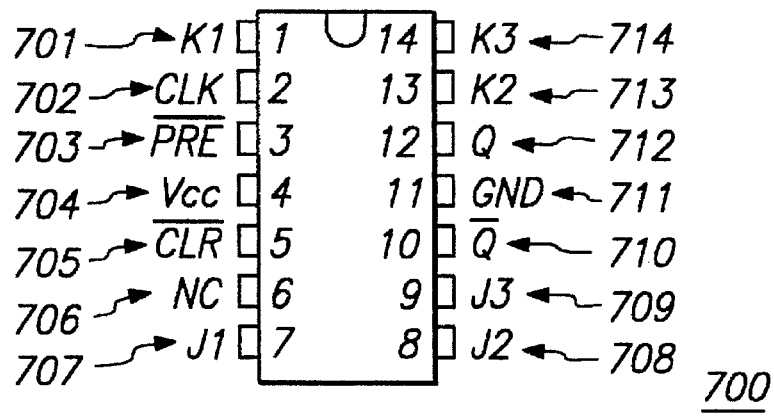
FIG. 7 is an illustration of a pin diagram for a Texas Instruments SN5472 AND-GATED J-K positive-edge-triggered flip-flop with PRESET and CLEAR.
Figure 8:
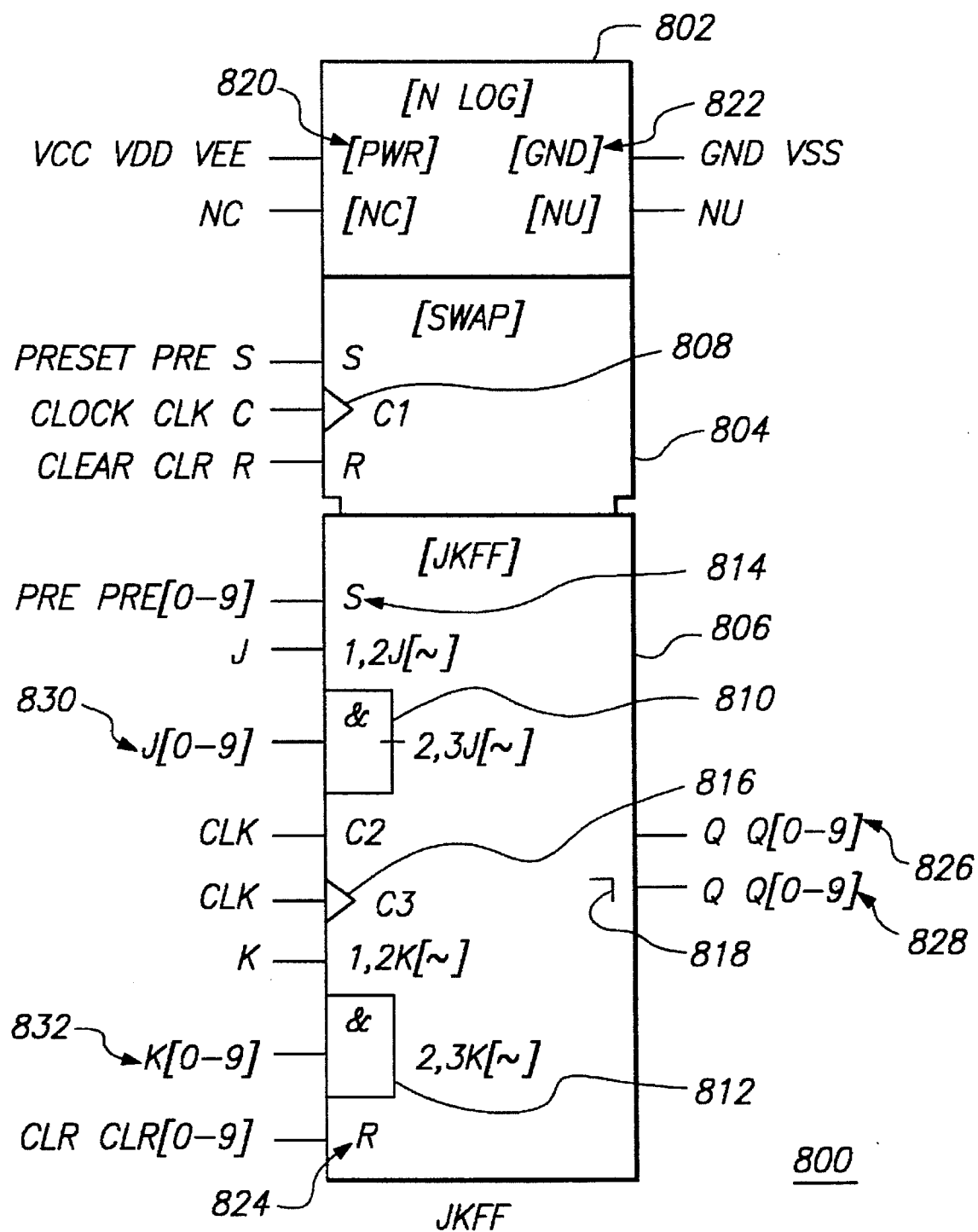
FIG. 8 is an illustration of a J-K flip-flop template according to the preferred embodiment of the present invention.

FIG. 7 illustrates a pin diagram for a Texas Instruments SN5472 AND-GATED J-K positive-edge-triggered flip-flop with PRESET and CLEAR. FIG. 8 illustrates a J-K flip-flop template of the present invention. In FIG. 7, pins 707, 708, and 709 have physical pin names J1, J2, and J3, respectively. The function template generator 318 determines that the physical pin names for pins 707, 703, and 709 are a sequence. The technique for determining sequences is described below. Physical pin names J1, J2 and J3 are associated with a single logical pin name J[0–9] as illustrated in FIG. 8. The numbers 0–9 associated with the J pin are not important, as long as the minimum number of matching pins are identified when generating an instance, described below. Additionally, there is no limit as to the number of pins that can be combined to form a sequence.

The function template generator 318 combines sequences of physical pin names and associates the sequence with a single logical pin name by analyzing the physical pin names for sequences of letters and numbers. The common characters are replaced with a generic indication of the type of sequence that is replaced. Other features, e.g., overbarring (used to indicate negative polarity), are eliminated from logical pin names to permit a broader logical pin definition. Examples of sequences of physical pin names and the associated logical pin name are set forth. The sequence of physical pin names 1A..4A are combined by the function template generator 318 into a single logical pin name "[1–4]A." Physical pin names OUTPUT1..OUTPUT9 are combined into a single logical pin name "OUTPUT[1–9]." Physical pin names "1A1, 1B1, 1C1, 1A2, 1B2, 1C2, 2A1, 2B1, 2C1, 2A2, 2B2, 2C2" are combined to form a single logical pin name "[1–2][A–C][1–]."

Non-logical pins, e.g., VCC 704, GND 711, and NC 706, are not combined 410 by the function template generator 318. Combining 410 sequences of physical pin names into logical pin names is achieved by removing all characters used to indicate negative polarity and overbarring from all logical pins, as discussed above. Sequences of logical pin names are determined by identifying whether each physical pin name begins or ends with a sequence letter or number. If so, the common sequence letter or number is removed from the physical pin name. The process repeats to determine secondary sequences of letters or numbers until no possible pin sequences remain. Identical pin names are combined to form a single logical pin name. Each logical pin name is tagged with a list of data pointers to identify the relationship between the logical pin name and the original physical pin names.

After combining 410 sequences of physical pin names into logical pin names the function template generator 318 selects 416 a logical pin name. The function template generator 318 determines 418 if a matching logical pin name, or alias, exists in the data representation of the function template, hereafter referred to as the function template. When operating in automatic mode, the function template generator 318 determines 418 if a matching logical pin exists by comparing both the logical pin name and the logical pin dependencies. The features of the function template are described below.

A function template 800 for a JKFF functional category is illustrated in FIG. 8. The template is comprised of all features found on each component having the same functional category. The function template 800 is comprised of pins, elements, and dependency notations as described above. Pins denote electrical connections to the device. Elements are groups of pins and sub-elements that comprise a functional unit within the device. Dependency notations are graphics, including text, that are used to describe detailed functional relationships between groups of pins. The standard defines eleven dependencies. The eleven dependencies and their graphical notations are: control (C); mode (M); logical AND (G); logical OR (V); logical EXCLUSIVE OR, or negate (N); interconnection (Z); enable (EN); address (A); transmission (X); set (S); and reset (R). In addition to dependencies, one or more attributes, e.g., a dynamic clock or a postponed output, may be associated with a pin. Pins, elements, dependency notations and other features of the standard are described in greater detail in IEEE, Inc., Graphical Symbols for Logic Functions, IEEE Standard 91-1984 with Supplement Standard 91a-1991 (1991), that is hereby incorporated by reference in its entirety.

The graphical view of the function template of FIG. 8 includes an element 802 comprising the shared non-logic (NLOG) pins. The NLOG element 802 includes four pins: (1) a power pin [PWR] having logical pin name aliases, hereafter aliases, of VCC, VDD and VEE; (2) a ground pin [GND] having aliases of GND and VSS; (3) an unconnected pin [NC]; and (4) an unusable pin [NU].

A second element is a common control element 804 comprising pins that are shared between multiple flip-flops. The common control element 804 is marked "[SWAP]" because the sets of pins that comprise each flip-flop can be swapped between each other. The common control element 804 includes three pins: (1) a set pin having the set dependency "S" and having aliases of PRESET, PRE, and S; (2) a clock pin having a dynamic attribute illustrated by the graphical notation 808, a control dependency notation "C1", and having aliases of CLOCK, CLK, and C; and (3) a reset pin having the reset dependency "R" and having aliases of CLEAR, CLR and R.

The third element is the J-K flip-flop element 806 and is marked [JKFF]. The JKFF element 806 includes the following pins: a set pin 814 having the set dependency "S" and having aliases of PRE and PRE[0–9]; a J-pin having a "J" attribute and having a logical pin name of "J"; a pulse triggered clock pin having a second control dependency "C2" and having a logical pin name of "CLK"; an edge triggered clock pin having a third control dependency "C3", a dynamic attribute 816, and having a logical pin name of "CLK"; a K-pin having a "K" attribute and having a logical pin name of "K"; a reset pin having the reset dependency "R" and having aliases of CLR and CLR[0–9]; an output pin Q having the alias Q and Q[0–9], and a postponed output pin Q, having a postponed attribute 818 and having aliases of Q, and Q[0–9].

The JKFF element 306 also comprises two sub-elements 810, 812. Sub-element 810 illustrates the AND function having an internal output pin having a "J" attribute and affected by control dependencies 2 and 3. Sub-element 810 has as its input the logical pin J[0–9] 830. Sub-element 812 illustrates the AND function having an internal output pin having a "K" attribute and affected by control dependencies 2 and 3. Sub-element 812 has as its input the logical Din K[0–9] 832.

Referring again to FIG. 4B, if a matching logical pin name exists on the function template the function template generator 318 determines 420 if there is exactly one matching logical pin name on the function template. When operating in automatic mode, the function template generator 318 randomly chooses the first matching pin (name, dependencies, and attributes), as described below. If exactly one matching logical pin name exists on the template, a user ensures 422, in manual mode, that the dependencies associated with the chosen logical pin match the dependencies associated with the matching logical pin name in the function template 800, by using the function template editor 324. When operating in automatic mode, the function template generator 318 automatically compares 418 both the logical pin names and the logical pin dependencies. If more than one matching logical pin is found, the first logical pin is chosen to satisfy step 420.

If the dependencies associated with the chosen logical pin match the dependencies associated with the matching logical pin name in the function template match, the function template generator 318 associates 424 the logical pin name with the matching pin name on the function template. The process, i.e., steps 416–426, repeats 428 until all logical pin names of the component have been chosen.

If the function template generator 318 either determines 418 that there is no matching logical pin name on the function template, determines 420 that there is more than one matching logical pin name on the function template, or determines 422 that the pin dependencies awe not the same, the function template editor 324 determines 426 if the chosen logical pin can be aliased with an existing logical pin name on the function template.

FIG. 5 illustrates the flow diagram of step 426. When the CIWB is operating in manual mode the user determines 504 if an equivalent logical pin is presently on the function template 800 via the function template editor 324. When the CIWB is operating in automatic mode the template editor 324 is not invoked. Instead, the function template generator 324 compares 418 the dependencies and attributes of the logical pins and the template pins. If a pin is unmatched it is skipped.

If an equivalent logical pin is on the function template 800, the function template editor 324 aliases 506 the logical pin name to the equivalent pin on the function template. Functionally identical pins that perform the same function often have different names when the pins are on components from different manufacturers. For example, in FIG. 8, pins performing a timing or clock function in the SWAP element 804 are called "CLOCK", "CLK", or "C." These are aliases of the same pin because the pin associated with each logical pin name performs the same function. The aliasing feature enables the CIWB to reduce the template size by eliminating redundant pins. After aliasing 506 the logical pin name to the equivalent pin name on the function template 800, the process, i.e., steps 416–426, repeats 428 until all logical pin names of the component have been chosen.

If no equivalent logical pin exists on the function template 800 as determined 504 by the function template editor 324, new logical pins and elements are created 508 and stored with the template data.

FIG. 6 illustrates the flow diagram of step 508. When the CIWB operates in manual mode the user determines 604, using the function template editor 324, whether the appropriate logical element currently exists on the function template 800. If the appropriate logical element does not exist on the function template 800 the function template editor 324 creates the appropriate logical element on the function template 800. Two examples of such logic elements are AND sub-elements 810 and 812 illustrated in FIG. 8. Sub-elements 810, 812 are not initially present on the function template 800. When the first JKFF component using these sub-elements is received by the CIWB 210 the function template editor 324 creates and places 606 the AND sub-elements 810, 812 in the function template. Thereafter, when a component is received that requires the AND sub-elements 810, 812 the function template editor 324 determines that the appropriate logical element is present on the function template and the function template editor 324 does not create 606 a new logical element.

Steps 604–606 are repeated until all appropriate logical elements are represented by the function template 800. The function template editor 324 then creates and places the logical pin on the function template. The function template editor 324 then determines 610 if the logical pin has a dependency with any existing pins. For each such pin the function template editor 324 creates and places 612 dependency notation on the newly created logical pin. After creating and placing logical elements 606 and pins 608 on the function template, the process, i.e., steps 416–426, repeats 428 until all logical pin names of the component have been chosen 416.

The function template editor 324 operates on templates and instances. As discussed above, templates represent multiple components having the same functional category. Instances represent the function of a single component, e.g., the Texas Instruments SN5472 AND-GATED J-K positive-edge-triggered flip-flop with PRESET and CLEAR described above. Given a template, the function template generator 318 generates an instance by matching all of the component pins to the template, as described above, and then removes all dependency notations, pins, and elements that are not present in the particular component from the template. The method of generating an instance is similar to the method of generating a function template, described above. When generating an instance, each pin or sequence of pins on the component is associated with a pin on the template. The instance is created using only those pins that have been associated with a component pin and only that dependency notation that applies to these pins. Similarly, only those elements that contain these pins are used. An example of the procedure for generating an instance is set forth below.

As discussed above, FIG. 7 illustrates a pin diagram for a Texas Instruments SN5472 AND-GATED J-K positive-edge-triggered flip-flop with PRESET and CLEAR, hereafter "JKPFF". A user indicates 404 the functional category of the JKPFF, e.g., a JKFF functional category, using the function component data editor 322. The function template processor 318 determines 406 if the function template for the JKFF category exists in the function templates module 312. For this example, the JKFF template 800 has been generated using the technique described above. The function template generator 318 then combines 410 sequences of physical pin names into logical pin names. As described above, the sequence of physical pin names "K1" 701, "K2" 713, and "K3" 714 are associated with the logical pin name "K[0–9]" 832, shown in FIG. 8. The sequence of physical pin names "J1" 707, "J2" 708, and "J3" 709 are associated with the logical pin name "J[0–9]" 830, shown in FIG. 8. The logical pin names of the CLK pin 702, PRE pin 703, CLR Din 705, and the two Q pins 710, 712 on the JKFF element 806 of the function template 800 are the same as the physical pin names illustrated in FIG. 7, excluding the overbarring, as discussed above. The logical pin names of the VCC pin, GND pin, and NC pin on the NLOG element 802 of the function template 800 are the same as the physical pin names illustrated in FIG. 7.

Associated with each pin on the function template 800 is a data block indicating how many physical pins 701–714, and which physical pins 701–714 are associated with a template pin. In the example, the PWR pin 820, GND pin 822, S pin 814, the CLK pin 816, the R pin 824, the first Q pin 826, and the second Q pin 828 each have a data block indicating that one physical pin is associated with it. The J[0–9] pin 830 and the K[0–9] pin 832 each have a data block indicating that three physical pins are associated with it. An instance includes the template and the data blocks.

As discussed above, instance generation can occur simultaneously with template generation. When operating simultaneously, the function template generator 318 and the function template editor 324 generates the template by adding a new component using the technique described above. The CIWB 210 generates an instance by tagging, described above, a logical pin name every time the logical pin name is either associated 424 with a physical pin name on the component, aliased 324 with a physical pin name on the component, or created 612 to match a physical pin name using the techniques described above. The tagged pin names represent the instance.

The instance is not a functional logic symbol, it is data that represents a functional logic symbol. The functional logic symbol is created by using rules that describe the graphics according to the standard. These rules are stored in the symbol generation rules module 314. The rules are generally based upon the standard, as described above. However, the symbol generation rules editor 326 enables a user to customize the rules to create a unique rule set. The CIWB 210 will permit functional logic symbols to be generated accurately and consistently based upon the unique rule set. Rule sets can cover many styles of functional logic symbols, including the rectangular symbols of the standard or the more traditional shovel-and-spade shaped gates, triangular buffers and amplifiers, trapezoidal adders and multiplexers, as well as distinctively-shaped analog and discrete symbol shapes.

Figure 9:
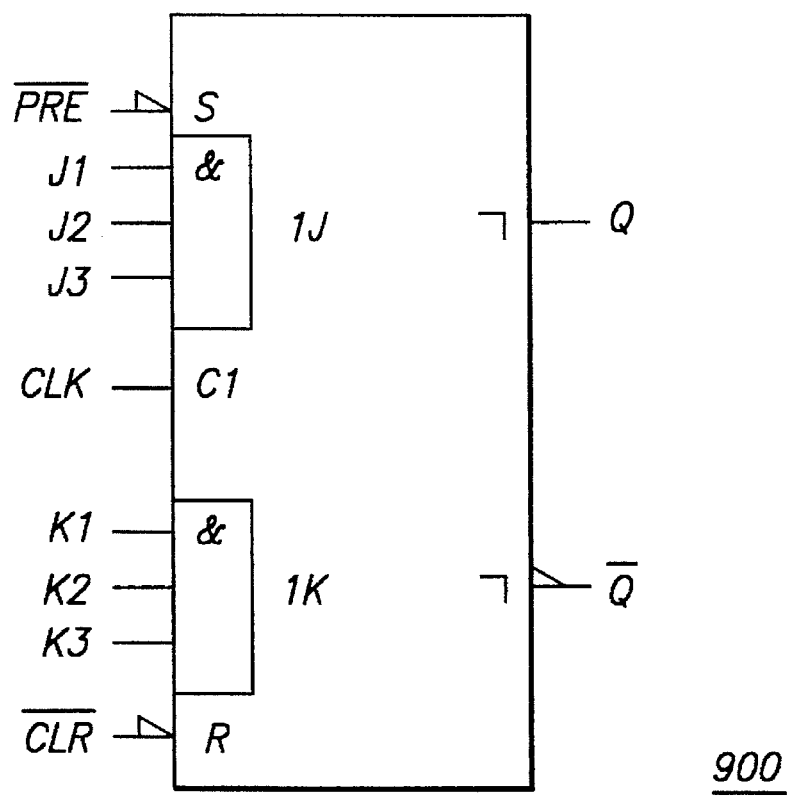
FIG. 9 is an illustration of a Texas Instruments SN5472 AND-GATED J-K positive-edge-triggered flip-flop with PRESET and CLEAR in accordance with the ANSI/IEEE Standard 91-1984, generated by the preferred embodiment of the present invention.

The rule based symbol generator 320 applies all appropriate rules in a given rule set to an instance to produce a display list. A display list is a neutral graphical format comprising text, rectangles, and line segments. The display list can be viewed in a graphics window via the graphic user interface 212. Rule sets can be modified interactively through the symbol generation rules editor 326. As the rule set is modified, the display list is modified accordingly. After the rule list is finalized, the resulting display list is converted to a schematic symbol (functional logic symbol) library format, e.g., a Concept body file. The Concept body file is described in the Concept Users Manual, Cadence Design Systems, San Jose, Calif. Using the rule based symbol generator 320, a functional logic symbol 900 illustrating the Texas Instruments SN5472 AND-GATED J-K positive-edge-triggered flip-flop with PRESET and CLEAR in accordance with the ANSI/IEEE Standard 91-1984 is created as illustrated in FIG. 9.

The present invention is a system and method for quickly generating accurate and consistent functional logic symbol using a function template. In addition the present invention reduces the expense in generating and maintaining the symbol library.

What is claimed is:

1. A computer based method for generating a first data structure within a storage device, the first data structure representing a plurality of pins on a functional class of electrical devices, comprising the steps of:

(1) receiving a first name for each of the plurality of pins associated with a first device of the electrical devices;

(2) associating two or more of said first names with a first common pin name including the steps of
      (a) determining a sequence of said first names from said plurality of pins wherein said sequence of first names represents said first names that are related;
      (b) generating said first common pin name; and
      (c) associating said sequence of first names with said first common pin name; and (3) correlating said first common pin name with a first template pin name if said first common pin name is uniquely present within the first data structure.

2. The method of claim 1, wherein step (2)(a) comprises the steps of:

identifying whether each of said first names begins or ends with a sequence of common characters; and grouping all first names having the same sequence.

3. The method of claim 1, wherein said first common pin name is uniqely present within the first data structure if said first common pin name matches only one first template pin name in the data structure.

4. The method of claim 3, wherein said first common pin name is uniqely present within the first data structure if said first common pin name matches said first template pin name and if a first attribute of said first common pin name matches a first attribute of said first template pin name.

5. The method of claim 4, further comprising the step of:

associating said first common pin name with a first template pin name if said first common pin name is not present on the first data structure and if a first attribute, associated with said first common pin name, matches a first template attribute associated with said first template pin name.

6. The method of claim 5, further comprising the step of:

(5) storing said first common pin name in the first data structure if said first common pin name is not present on the first data structure and if a first attribute, associated with said first common pin name, does not match a first template attribute associated with said first template pin name.

7. The method of claim 6, further comprising the step of:

(6) creating a second data structure by identifying each first template pin name associated with said first common in name in step (4).

8. The method of claim 7, further comprising the step of:

(6) receiving one or more rules; and (7) generating a symbol representing said first device by applying said rules to said second data structure.

9. The method of claim 8, wherein said symbol is consistent with a IEEE standard 91.

10. A machine having a memory which contains data representing a data structure generated by the method of any of claims 2 through 9.

11. A storage device containing a data structure generated by the method of any of claims 2 through 9.

12. A computer based method for generating a first template within a storage device, the first template representing a plurality of pins on a functional class of electrical devices, comprising the steps of:

(1) receiving a first name for each of the plurality of pins associated with a first device of the electrical devices;

(2) associating two or more of said first names with a first common pin name including the steps of
      (a) determining a sequence of said first names from said plurality of pins, wherein said sequence of first names represents said first names that are related;
      (b) generating said first common pin name; and
      (c) associating said sequence of first names with said first common pin name; and (3) correlating said first common pin name with a first template pin name if said first common pin name is uniquely present within the first template.

13. The method of claim 12, wherein step (2)(a) comprises the steps of:

identifying whether each of said first names begins or ends with a sequence of common characters; and grouping all first names having the same sequence.

14. The method of claim 13, wherein said first common pin name is uniquely present within the first template if said first common pin name matches only one first template pin name in the template.

15. The method of claim 14, wherein said first common pin name is uniquely present within the first template if said first common pin name matches said first template pin name and if a first attribute of said first common pin name matches a first attribute of said first template pin name.

16. The method of claim 15, further comprising the step of:

(4) associating said first common pin name with a first template pin name if said first common pin name is not present on the first template and if a first attribute, associated with said first common pin name, matches a first template attribute associated with said first template pin name.

17. The method of claim 16, further comprising the step of:

(5) storing said first common pin name in the first template if said first common pin name is not present on the first template and if a first attribute, associated with said first common pin name, does not match a first template attribute associated with said first template pin name.

18. The method of claim 17, further comprising the step of:

(6) creating a second template by identifying each first template pin name associated with said first common in name in step (4).

19. The method of claim 18, further comprising the step of:

(6) receiving one or more rules; and (7) generating a symbol representing said first device by applying said rules to said second template wherein said symbol is consistent with a IEEE standard 91.

* * * * *